(12) United States Patent
Imai

(10) Patent No.: US 6,573,027 B1
(45) Date of Patent: Jun. 3, 2003

(54) MANUFACTURING METHOD OF SEMICONDUCTOR DEVICE

(75) Inventor: Kiyotaka Imai, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/497,423

(22) Filed: Feb. 3, 2000

(30) Foreign Application Priority Data

Feb. 5, 1999 (JP) .......................................... 11-029092

(51) Int. Cl.[7] ................ G03F 7/00; G03F 7/20
(52) U.S. Cl. ................ 430/311; 430/313; 430/317; 430/394; 430/396
(58) Field of Search ................ 430/311, 313, 430/317, 396, 394

(56) References Cited

U.S. PATENT DOCUMENTS

| | | | | |
|---|---|---|---|---|
| 5,419,988 A | * | 5/1995 | Mohri et al. | 430/5 |
| 5,422,205 A | * | 6/1995 | Inoue et al. | 430/5 |
| 5,770,350 A | * | 6/1998 | Lee | 430/325 |
| 5,821,169 A | * | 10/1998 | Nguyen et al. | 438/736 |
| 5,989,788 A | * | 11/1999 | Bae et al. | 430/326 |
| 6,074,787 A | * | 6/2000 | Takeuchi | 430/5 |
| 6,134,008 A | * | 10/2000 | Nakao | 356/363 |
| 6,153,465 A | * | 11/2000 | Jenq et al. | 438/255 |
| 6,204,187 B1 | * | 3/2001 | Rupp et al. | 438/702 |
| 6,245,489 B1 | * | 6/2001 | Baklanov et al. | 430/313 |
| 6,271,154 B1 | * | 8/2001 | Shen et al. | 438/942 |
| 6,365,509 B1 | * | 4/2002 | Subramanian et al. | 438/636 |
| 6,436,810 B1 | * | 8/2002 | Kumar et al. | 438/633 |
| 2002/0155395 A1 | * | 10/2002 | Nakao | 430/394 |

FOREIGN PATENT DOCUMENTS

| | | |
|---|---|---|
| JP | 3-173219 | 7/1991 |
| JP | 4-76551 | 3/1992 |
| JP | 04-107457 | 4/1992 |
| JP | 4-155812 | 5/1992 |
| JP | 4-337732 | 11/1992 |
| JP | 4-369823 | 12/1992 |
| JP | 5-206082 | 8/1993 |
| JP | 8-51068 | 2/1996 |
| JP | 8-179492 | 7/1996 |
| JP | 10-189441 | 7/1998 |
| JP | 11-15129 | 1/1999 |
| KR | 1990-0007055 | 5/1990 |
| KR | 1998-068052 | 10/1998 |

OTHER PUBLICATIONS

Koji Matsuoka et al.; Application of alternating phase–shifting mask to 0.16um CMOS logic gate patterns; Semiconductor.
Research Center, Matshushita Electric Ind. Co. Ltd. SPIE vol. 3051; pp. 342–351.

* cited by examiner

*Primary Examiner*—Janet Baxter
*Assistant Examiner*—Amanda C. Walke
(74) *Attorney, Agent, or Firm*—Katten Muchin Zavis Rosenman

(57) ABSTRACT

The present invention relates to a method of manufacturing a semiconductor device; which comprises the steps of forming a film of a hard mask material, on a pattern-forming film which is to be used to form a prescribed pattern, and then forming a photoresist film over said film of the hard mask material; carrying out a first exposure using a first mask with a phase shifter and subsequently making a development; etching said film of the hard mask material using the formed resist pattern as a mask; forming a photoresist film so as to cover the formed hard mask pattern; carrying out a second exposure using a second mask with a pattern which enables a portion of the photoresist covering only a required part of said hard mask pattern to remain after the exposure and the development, and subsequently making a development; removing, by means of etching, an unrequited part of the hard mask which is not covered with any portion of said photoresist; and etching said pattern-forming film using the remaining hard mask pattern as a mask. With the present invention, a semiconductor device having high reliability and excellent element characteristics can be produced in a high yield.

16 Claims, 8 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and more particularly to a method of pattern formation using a phase-shift mask.

2. Description of the Related Art

For the purpose of achieving a higher integration in a semiconductor device, formation of a minuter and more densely spaced pattern in the step of photolithography has been being sought after. Accordingly, while the exposure method with reduced projection is, in general, currently used for the exposure in the step of photolithography, the phase-shift method is employed therein so as to raise the limit of resolution further and bring about formation of a still minuter and more densely spaced pattern.

The basic principle of the phase-shift method is briefly described below, taking the case of forming the line and space (L/S) patterns by the Levenson-type phase-shift method. In this case, there is utilized an alternating phase-shift mask in which lines are formed of a light-shielding material on a transparent substrate and phase shifters are placed every other opening sections (space sections). The light passing through an opening section of this mask travels through a lens and produces an image on a resist film lying on a wafer. If the distance between two neighboring opening sections becomes considerably short, when the normal mask without a phase shifter is used, the diffracted lights traveling from these two neighboring opening sections are equal in phase so that, through their mutual interference, the images of these two neighboring opening sections cannot separate from each other. In contrast with this, with a phase-shift mask, phase difference between two lights from each neighboring opening thereof is 180 degrees and so, the two lights interfere each other, diffracted lights are destroyed and, consequently, the images of these two neighboring opening sections separate from each other.

The phase-shift method of this sort is used for the formation of repetition patterns such as the L/S patterns, solitary patterns, random patterns and the likes and applied to the fabrication of various semiconductor devices including bit lines of a DRAM (Dynamic Random Access Memory) and gate patterns of a CMOS (Complementary Metal-Oxide-Semiconductor). For example, in Proc. SPIE (Proceedings of Society of Photo-optical Instrumentation Engineering), Vol. 3051, pp. 342–351 (1997), there is reported a study in which the phase-shift method is applied to obtain 0.16 $\mu$m CMOS gate patterns.

The general method to form minute gate patterns by the phase-shift method is described below.

In this method, two exposures are made using two different masks shown in FIGS. 2(a) and (b) separately for respective exposures and, with a composite image obtained from the exposures through these two masks, gate patterns are formed on a wafer. FIG. 2(a) is a view showing the layout of a phase-shift mask (mask A) in which light-shielding sections for lines 22 and phase shifter sections 23 are formed on a transparent substrate 21. The patterns seen in the light-shielding sections for the lines 22 are the very patterns required to be formed. FIG. 2(b) is a view showing the layout of the other mask (mask B) in which a light-shielding section for protection 24 is formed in order to protect, against the second exposure, portions of a positive resist that are placed in the position of the gate patterns required to be formed, after the first exposure with the mask A is performed.

FIG. 3 presents patterns which are transcribed on the positive resist lying on a wafer, using the aforementioned mask A, mask B or both. FIG. 3(a) shows transcription patterns obtained by the first exposure with the mask A. Ring-shaped patterns are therein transcribed, which indicates patterns other than those formed by the light-shielding sections for the lines 22 are also transcribed. The sections of each ring-shaped patterns are formed by the edge of each phase shifter section. This results from a fact that the amplitude of the light is weakened at the edge sections around the phase shifter sections 23 and, thus, the light is shielded in substance. FIG. 3(b) shows the positioning relation between patterns transcribed by the first exposure with the mask A and patterns transcribed by the second exposure with the mask B. At the time of the second exposure, the mask B must be aligned in such a way that the portions of the resist placed in the position of the gate patterns required to be formed are well protected by the light-shielding section for protection 24. FIG. 3(c) showed resist patterns obtained, after the second exposure following the first exposure is made and then a subsequent development is carried out. Since irradiation is applied, at the second exposure, to the superfluous part of the patterns that are transcribed at the first exposure by shielding the light, the resist in that part is removed by the development, and thereby the prescribed resist patterns are formed.

Next, a method in which resist patterns are formed using two different masks described above and then the gate patterns are formed on a silicon substrate is described. FIG. 4 is two sets of schematic cross-sectional views illustrating the steps of this formation method. FIGS. 4 (a1)–(a4) is cross-sectional views taken along the line A—A' of FIG. 3(b) and FIGS. 4 (b1)–(b4) are cross-sectional views taken along the line B—B' of FIG. 3(b).

First, upon a silicon substrate 101, a gate oxide film 102 is formed and thereon a polysilicon film 103 is formed. Further, over that, a positive photoresist film 105 is formed. A first exposure is then applied to this silicon substrate through the mask A (106) (FIGS. 4 (a1), (b1)). Regions of the resist corresponding to the edge sections of the phase shifter sections 23 and the light-shielding sections for the lines 22 in the mask A are not irradiated so that ring-shaped patterns of the unexposed regions shown in FIG. 3(a) are transcribed.

Next, the mask B (107) is aligned so as to make its transcription patterns take the positioning relation shown in FIG. 3(b) and, then, through this mask B, a second exposure is made (FIGS. 4 (a2), (b2)). By this second exposure, the part of patterns of the unexposed regions caused by the edge sections of the phase shifter sections 23 in the mask A is also irradiated.

Subsequently, by performing a development, resist patterns 109 taking the shape shown in FIG. 3(c) are formed (FIGS. 4 (a3), (b3)). Using these resist patterns as a mask, the polysilicon film 103 is then etched and thereafter the resist 109 which becomes redundant is removed, and thereby gate patterns 110 corresponding to the resist patterns 109 are formed (FIGS. 4 (a4), (b4)).

The conventional method described above, however, has the following problem. Namely, as the spacing of the patterns narrows, the thinning of the patterns becomes conspicuous. If the final dimensions of the patterns very much shift from the designed values thereof because of that, various problems such as a decrease in the yield, a lowering of the reliability, the deterioration of element characteristics and the like are brought about.

The reason why such a thinning of patterns takes place is described, taking the case of the manufacturing method described above. In FIG. 3(b), if the spacing of the patterns or the distance between the lines (W1) narrows, the margin (W2) between the mask A and the mask B becomes small. When the margin (W2) becomes considerably small like this, the unexposed resist sections 108 that should be protected become liable to be affected by stray light. Consequently, the width (W3) of the resist patterns formed after performing the development is reduced, or in other words, the thinning of the patterns takes place.

SUMMARY OF THE INVENTION

An object of the present invention is to provide a manufacturing method of a semiconductor device, wherein, in the step of forming a pattern, even for a minute pattern with a narrow spacing, no thinning of the pattern takes place and the pattern practically having the designed dimensions can be formed.

The present invention relates to a method of manufacturing a semiconductor device; which comprises the steps of:

forming a film of a hard mask material, on a pattern-forming film which is to be used to form a prescribed pattern, and then forming a photoresist film over said film of the hard mask material;

carrying out a first exposure using a first mask with a phase shifter and subsequently making a development;

etching said film of the hard mask material using the formed resist pattern as a mask;

forming a photoresist film so as to cover the formed hard mask pattern;

carrying out a second exposure using a second mask with a pattern which enables a portion of the photoresist covering only a required part of said hard mask pattern to remain after the exposure and the development, and subsequently making a development;

removing, by means of etching, an unrequired part of the hard mask which is not covered with any portion of said photoresist; and etching said pattern-forming film using the remaining hard mask pattern as a mask.

Further, the present invention relates to a method of manufacturing a semiconductor device; which comprises the steps of:

forming a film of a hard mask material, on a pattern-forming film which is to be used to form a prescribed pattern, and then forming a photoresist film over said film of the hard mask material;

carrying out a first exposure using a second mask with a pattern which makes a required part in a resist region corresponding to a transcription pattern of a first mask that is to be used in a later step unexposed and makes an unrequited part therein exposed, and subsequently making a development;

etching said film of the hard mask material using the formed resist pattern as a mask;

removing said resist pattern and thereafter forming a photoresist film so as to cover the formed hard mask pattern;

carrying out a second exposure using a first mask with a phase shifter and subsequently making a development;

removing, by means of etching, an unrequired part of the hard mask using the formed resist patterns as a mask; and removing said resist pattern, and thereafter etching said pattern-forming film using the formed hard mask pattern as a mask.

With the present invention, a semiconductor device having high reliability and excellent element characteristics can be produced in a high yield.

DETAILED DESCRIPTION OF THE PREFERRED EMBODIMENTS

Taking the case of the gate pattern formation, the preferred embodiments of the present invention are described below.

While a mask having a phase shifter or a phase-shift mask is utilized in the present invention, the Levenson-type and the chromless-type phase-shift mask are particularly well suited herein. In the present embodiments, examples wherein a Levenson-type phase-shift mask is employed are described.

A hard mask used in the present invention is a film of an inorganic mask material formed on a film of a pattern-forming material that is to be patterned by means of dry etching, and this film of the hard mask material is composed of a film having a sufficiently small etching rate as against that of said film of the pattern-forming material and, thus, having a sufficiently large etching selection ratio. If a resist does not have a sufficiently large etching selection ratio to said film of the pattern-forming material, the resist can be used in a way wherein a film of a hard mask material is first patterned using the resist pattern as a mask and, then, by using this formed hard mask pattern as a mask, said film of the pattern-forming material is again subjected to the patterning through etching. On this occasion, when the film of the hard mask material is etched with the resist pattern being used as a mask, it is required that the etching rate of the hard mask material is sufficiently large in comparison with that of the resist.

Figure 2A:
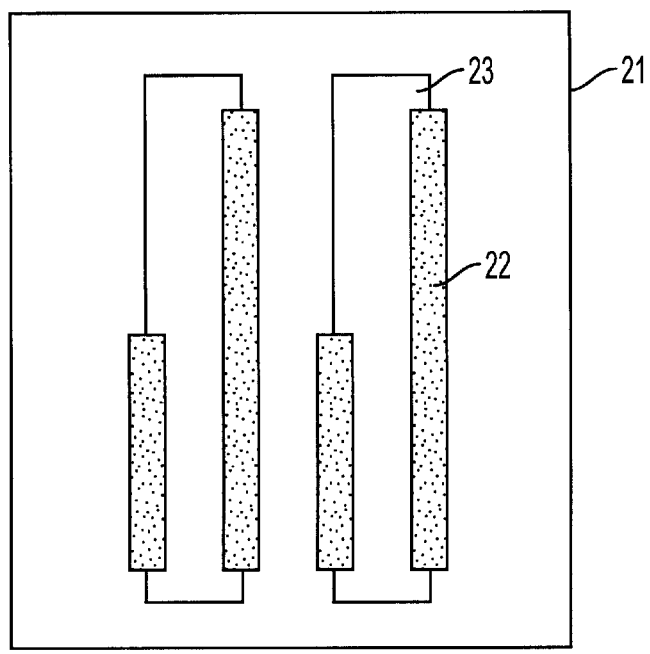
FIG. 2 is views showing the layout of the masks used in formation of gate patterns in accordance with the present invention.

In the present embodiment, there are used the same two separate masks shown in FIGS. 2(a) and (b) as those used in the afore-mentioned conventional method. FIG. 2(a) is a view showing the layout of a phase-shift mask (mask A) in which light-shielding sections for lines 22 and phase shifter sections 23 are formed on a transparent substrate 21 of a glass substrate or the like. The light-shielding sections 22 are formed out of a light-shielding material such as chromium, chromium oxide or the like. The phase shifter sections 23 are formed either out of a material that is different from the one of the substrate, for example, a silicon oxide film, or by changing the thickness of the substrate in the sections and thereby enabling the sections to induce a difference in phase of the passing light.

Figure 2B:
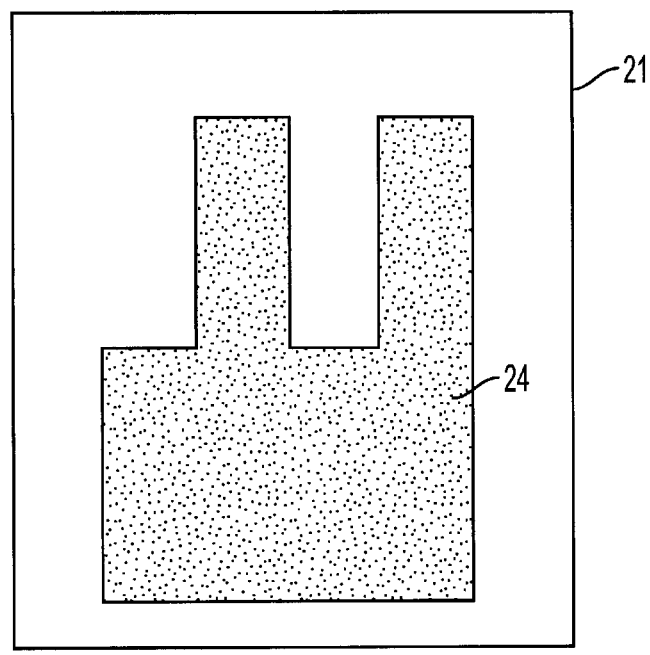

Incidentally, the patterns seen in the light-shielding sections for the lines 22 are the very patterns required to be formed. FIG. 2(b) is a view showing the layout of the other mask (mask B) in which a light-shielding section for protection 24 is formed in order to form a resist pattern to cover only portions of the hard mask sections which correspond to the gate patterns required to be formed.

Figure 3C:
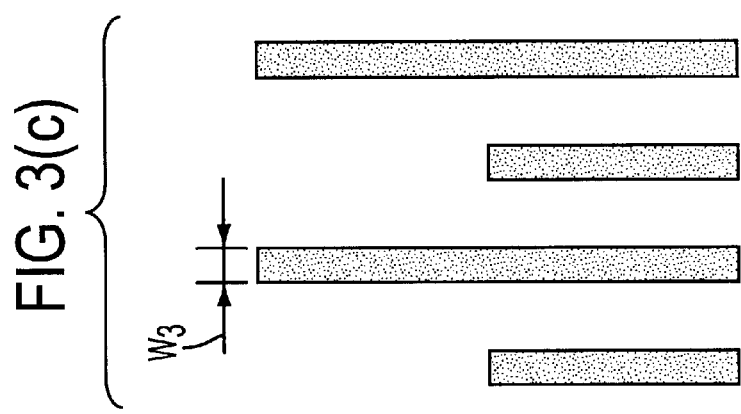
FIG. 3 is views showing the transcription patterns which are formed on a wafer by the exposure through one or two masks shown in FIG. 2.
Figure 3B:
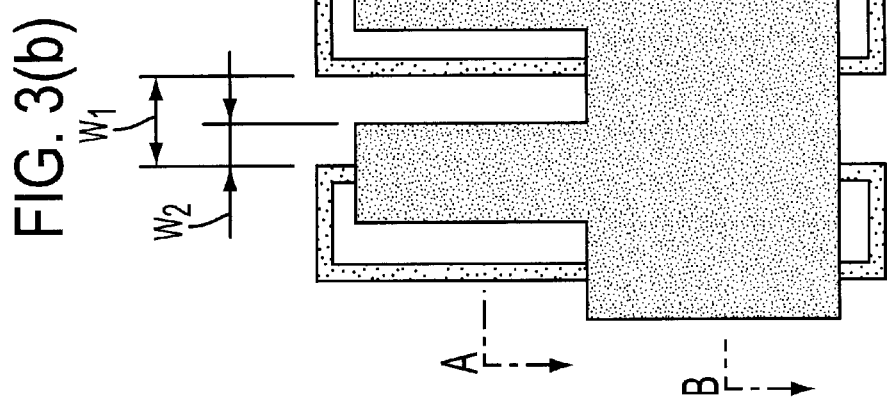
Figure 3A:
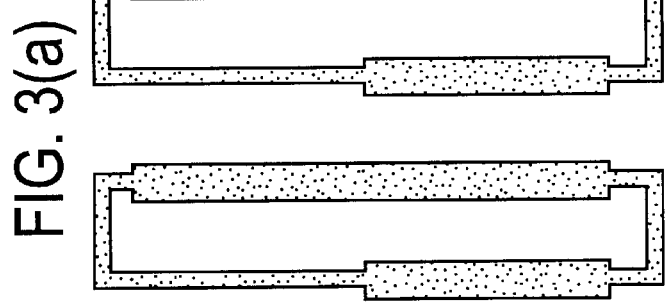
Figure 4:
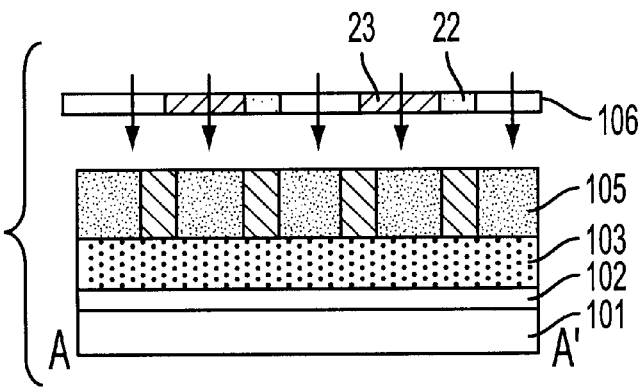
FIG. 4 is two sets of schematic cross-sectional views illustrating the steps of a conventional method of forming gate patterns using a phase-sift mask.
Figure 4:
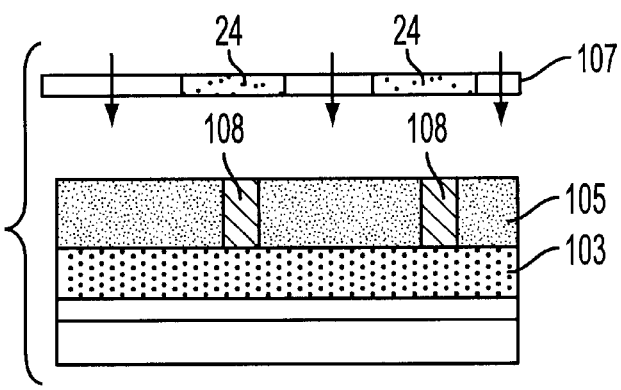
Figure 4:
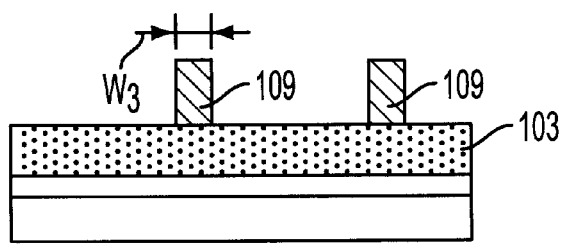
Figure 4:
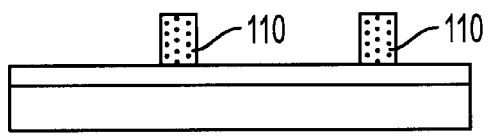
Figure 4:
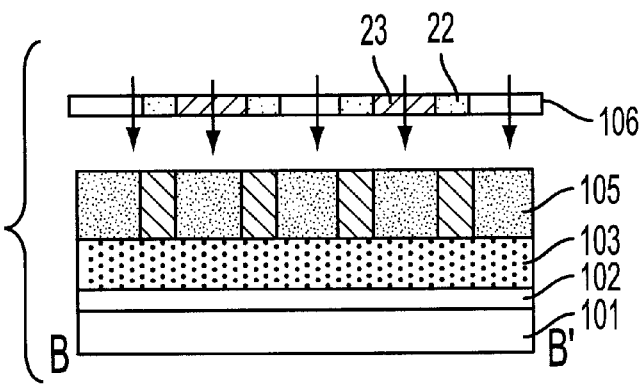
Figure 4:
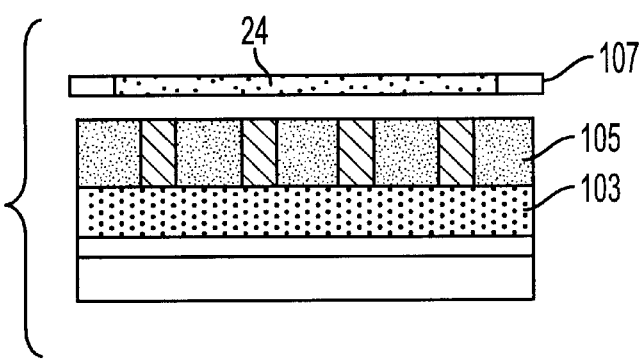
Figure 4:
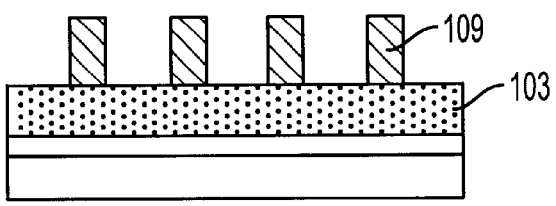
Figure 4:
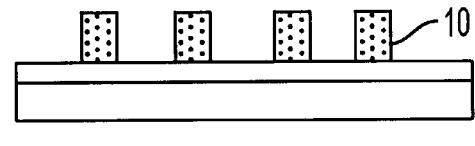

FIG. 3 presents patterns that are transcribed on a wafer, using the afore-mentioned mask A, mask B or both. FIG. 3(a) shows transcription patterns obtained by the first exposure with the mask A. Ring-shaped patterns are therein transcribed, which indicates patterns other than those formed by the light-shielding sections for the lines 22 are also transcribed. The sections of each ring-shaped pattern are formed by the edge of each phase shifter section. This results from a fact that the amplitude of the light is weakened at the edge sections around the phase shifter sections 23 and, thus, the light is shielded in substance. FIG. 3(b) shows the positioning relation between patterns transcribed by the first exposure with the mask A and patterns transcribed by the second exposure with the mask B. At the time of the second exposure, the mask B must be aligned in such a way that the resist pattern to cover only portions of the hard mask sections which corresponding to the gate patterns that are required to be formed can be properly formed. FIG. 3(c) shows hard mask patterns corresponding to the gate patterns required to be formed at the end. As mentioned under, the superfluous part of the hard mask formed according to the patterns that are transcribed at the first exposure by shielding the light is not covered with any resist and removed by means of etching, and thereby the prescribed hard mask patterns are formed.

Figure 1:
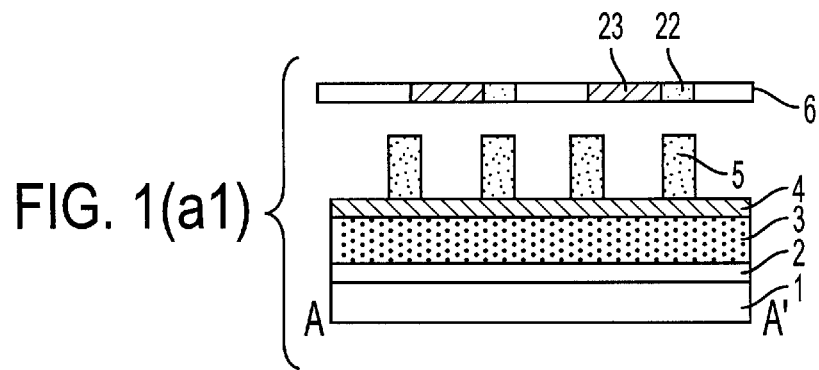
FIG. 1 is two sets of schematic cross-sectional views illustrating the steps of a method of forming gate patterns using a phase-sift mask in accordance with the present invention.
Figure 1:
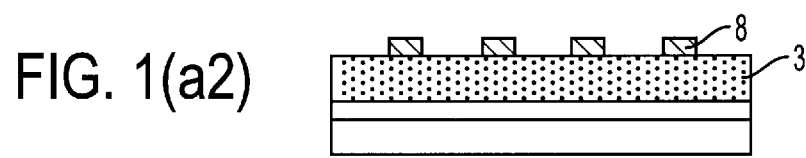
Figure 1:
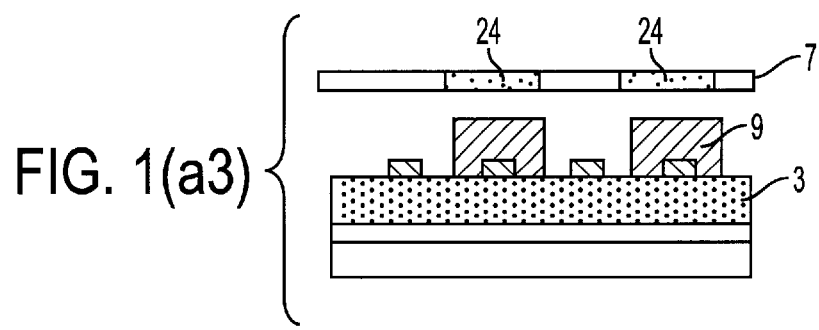
Figure 1:
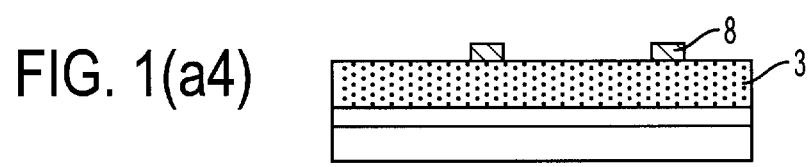
Figure 1:
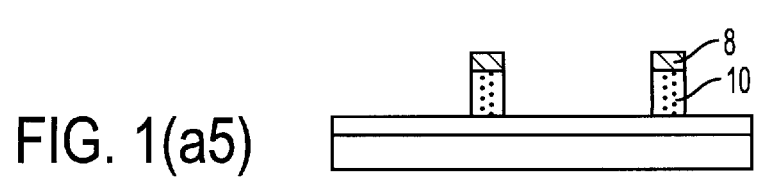
Figure 1:
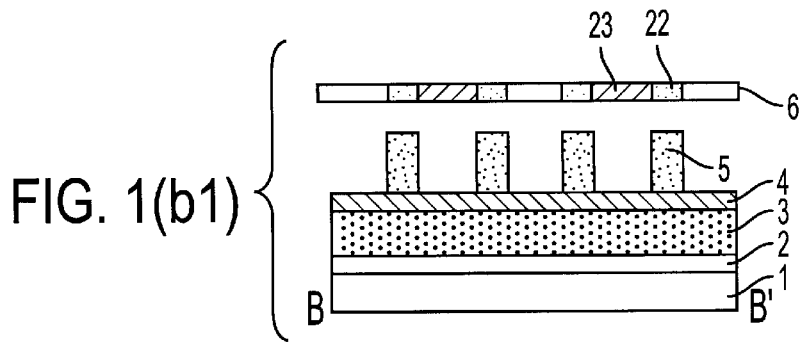
Figure 1:
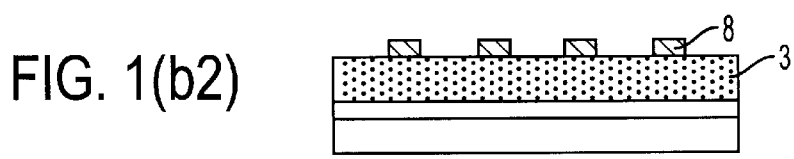
Figure 1:
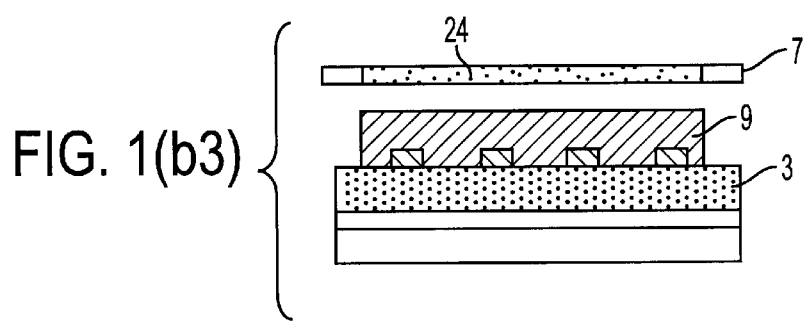
Figure 1:
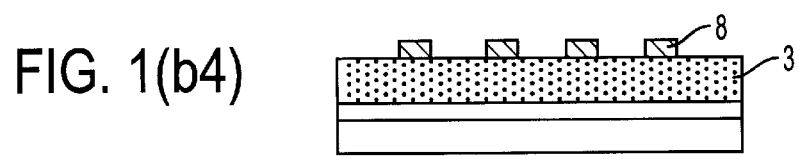
Figure 1:
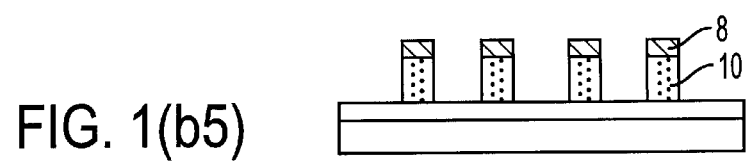

Next, there is described a method in which resist patterns and hard mask patterns are formed using two different masks described above and then the gate patterns are formed on a silicon substrate. FIG. 1 is two sets of schematic cross-sectional views illustrating the steps of this formation method. FIGS. 1 (a1)–(a4) is cross-sectional views taken along the line A—A' of FIG. 3(b) and FIGS. 1 (b1)–(b4) are cross-sectional views taken along the line B—B' of FIG. 3(b).

First, upon a silicon substrate 1, a gate oxide film 2 is formed and thereon a polysilicon film 3 is formed. Further, after a silicon oxide film 4 that is to be used for formation of a hard mask is formed over that, a positive resist film is formed.

A first exposure is then applied to this silicon substrate through the mask A (6) and, subsequently, a development is carried out. By this, regions of the resist corresponding to the edge sections of the phase shifter sections 23 and the light-shielding sections for the lines 22 in the mask A are not irradiated so that ring-shaped resist patterns 5 shown in FIG. 3(a) are formed (FIGS. 1 (a1), (b1)).

Next, using these resist patterns 5 as a mask, the silicon oxide film 4 is etched and thereby hard masks 8 are formed on the polysilicon film 3 (FIGS. 1 (a2), (b2)).

Nest, after a positive photoresist film is formed thereon, the mask B (7) is aligned so as to make its transcription patterns take the positioning relation shown in FIG. 3(b) and, then, a second exposure through the mask B and a subsequent development are carried out. By this, only the portions of the hard masks which correspond to the gate patterns required to be formed are covered with a resist for protection 9 (FIGS. 1 (a3), (b3)).

Next, the other portions of the hard masks which are not covered with this resist for protection 9 are removed by etching and then the resist for protection 9 itself is removed, and thereby the prescribed hard mask patterns 8 shown in FIG. 3(c) corresponding to the gate patterns that are required to be formed are obtained (FIGS. 1 (a4), (b4)).

Finally, by applying etching to the polysilicon film 3 with these hard mask patterns 8 being used as a mask, gate patterns 10 corresponding to these hard mask patterns 8 are formed (FIGS. 1 (a5), (b5)). The redundant hard masks remaining on the gate patterns are removed readily by etching.

Next, as another embodiment, an example in which the present invention is applied to the formation of gate patterns in a memory cell region of a SRAM (Static Random Access Memory) is described.

Figure 5B:
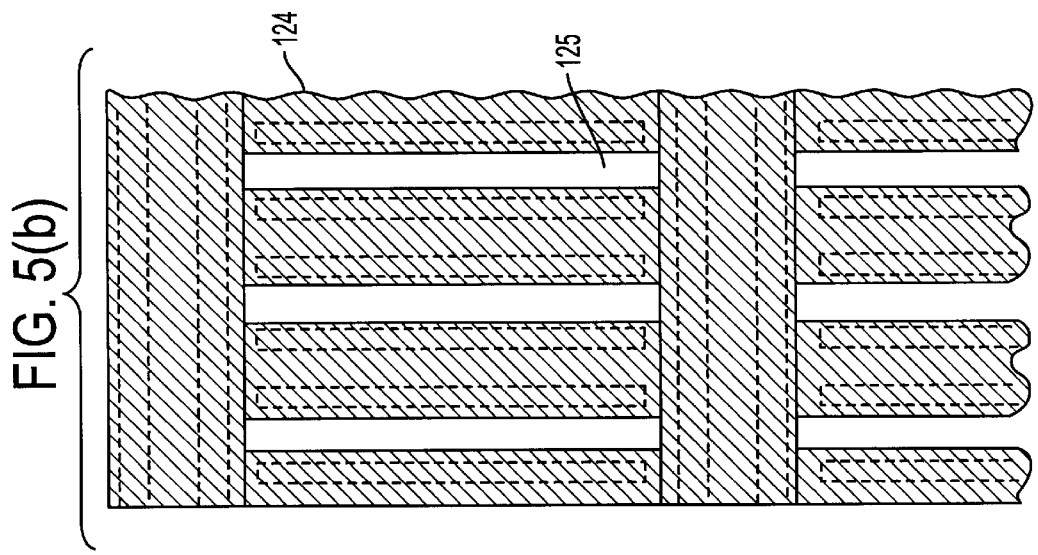
FIG. 5 is views showing the layout of the masks used in formation of gate patterns in accordance with the present invention.
Figure 5A:
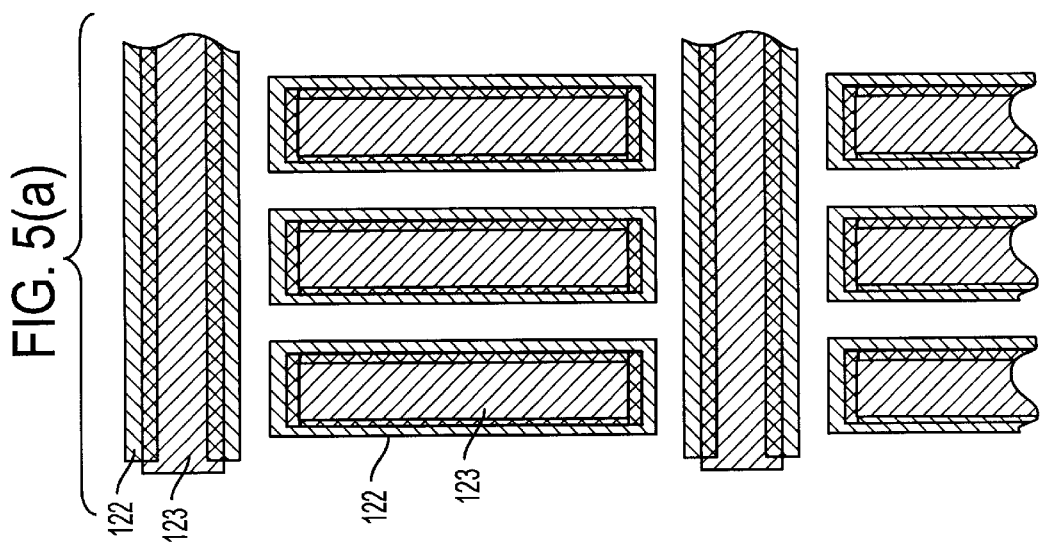

FIG. 5 is views showing the layout of the masks used therein. FIG. 5(a) shows a mask A for the line formation in which light-shielding sections for lines 122 and phase shifter sections 123 are formed on a transparent substrate and FIG. 5(b) shows a mask B for protection in which a light-shielding section for protection 124 is formed on a transparent substrate. Further, broken lines in FIG. 5(b) indicate the positions of the finished gate patterns.

Figure 6C:
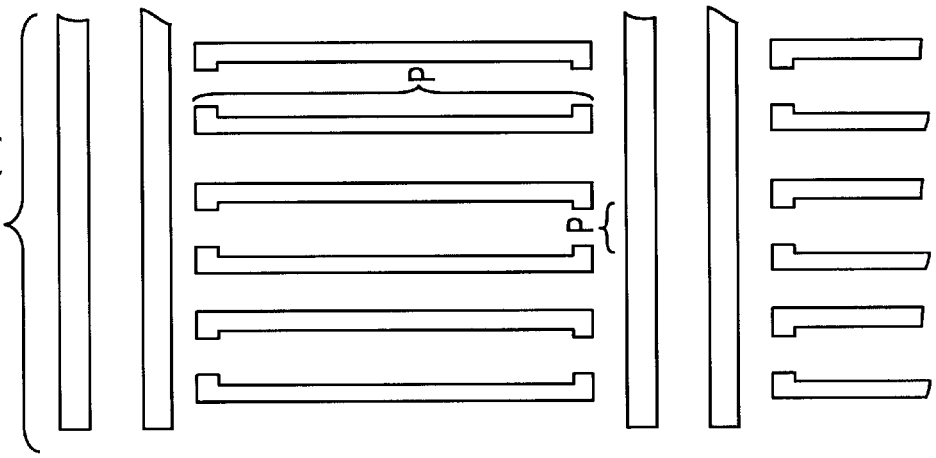
FIG. 6 is views showing the transcription patterns which are formed on a wafer by the exposure through one or two masks shown in FIG. 5.
Figure 6B:
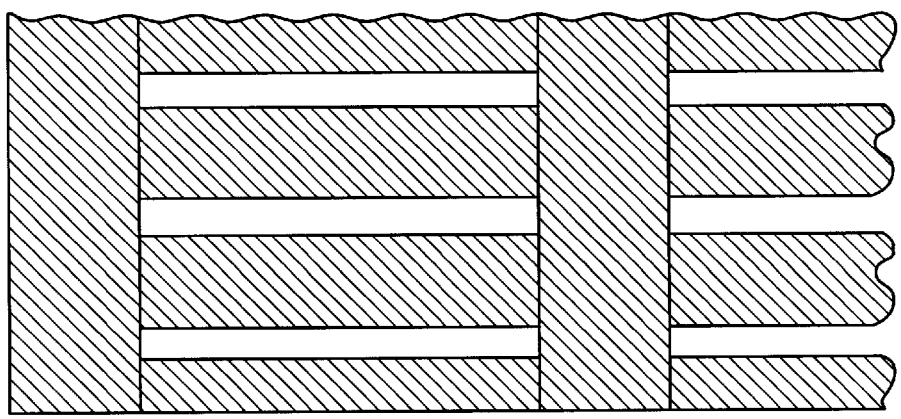
Figure 6A:
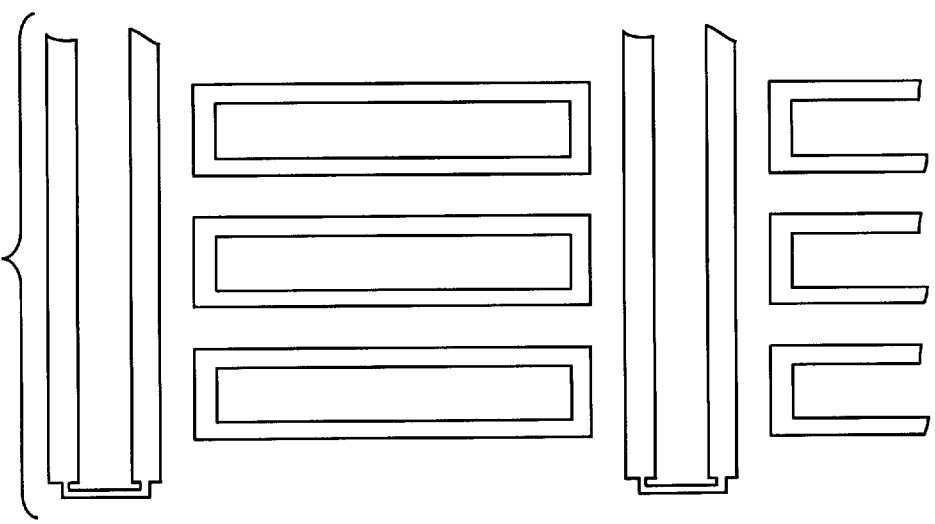

FIG. 6 is views showing the transcription patterns formed with masks shown in FIG. 5. FIG. 6(a) shows the transcription patterns formed with the mask A and FIG. 6(b), the transcription patterns formed with the mask B. In the same way as the embodiment described above, the prescribed gate patterns shown in FIG. 6(c) are formed through the pattern formation using both the mask A and the mask B.

In the conventional method, thinning is observed in the portions of lines p along the regions which correspond to the opening sections 125 of the light-shielding sections for protection 124. In contrast with this, patterns as designed in substance are obtained in the present invention.

In the present invention, because the very portions of the hard mask patterns corresponding to the gate patterns that are required to be formed are covered with the resist, the shape thereof does not undergo any change in the steps of forming hard mask patterns. Therefore, the gate patterns which are formed using these hard mask patterns as a mask have no problem concerning the shape thereof such as thinning, and, as a result, the gate patterns practically having designed dimensions can be obtained.

Further, as other embodiments of the present invention, the step of exposing with the mask A and the step of exposing with the mask B in the respective embodiments described above can be arranged in the reverse order. In other words, a silicon oxide film as a film of a hard mask material is formed on a polysilicon film and then a photoresist film is formed on said silicon oxide film. Next, a first exposure is carried out using a mask B with patterns which makes a required part in a resist region corresponding to the transcription patterns of a mask A that is to be used in a later step unexposed and makes an unrequired part therein exposed, and subsequently a development is performed. Following this, said silicon oxide film is etched, using the formed resist patterns as a mask. Then, after said resist patterns are removed, a photoresist film is formed so as to cover the formed patterns of the silicon oxide film. Next, a second exposure with the mask A and a subsequent development are carried out. Next, an unrequited part of the silicon oxide film is removed, by means of etching, using the formed resist patterns as a mask. Subsequently, after the resist patterns are removed, the polysilicon film is etched, using the formed patterns of the silicon oxide film as a mask.

Further, while the positive resist is utilized in the above description, a negative resist can be employed depending on the patterns.

The manufacturing methods of the present invention described above can be used for the formation of various patterns including repetition patterns such as the L/S patterns, solitary patterns, random patterns and the likes. They are particularly well suited for the formation of the L/S patterns, their combination patterns and the repetition patterns of those and, therefore, highly useful for the formation of all sorts of patterns in various semiconductor devices such as the DRAM, SRAM, CMOS and the like, which includes the formation of the bit lines and that of the gate patterns.

What is claimed is:

1. A method of manufacturing a semiconductor device; which comprises the steps of:
    forming a single layer film of a hard mask material, on a pattern-forming film which is to be used to form a prescribed pattern, and then forming a photoresist film over said film of the hard mask material;
    carrying out a first exposure using a first mask with a phase shifter and subsequently making a development;
    etching said film of the hard mask material using the formed resist pattern as a mask;
    forming a photoresist film so as to cover the formed hard mask pattern;
    carrying out a second exposure using a second mask with a pattern which enables a portion of the photoresist covering only a required part of said hard mask pattern to remain after the exposure and the development, and subsequently making a development;
    removing, by means of etching, an unrequired part of the hard mask which is not covered with any portion of said photoresist; and
    etching said pattern-forming film using the remaining hard mask pattern as a mask.

2. The method of manufacturing a semiconductor device according to claim 1, wherein said first mask is a Levenson-type phase-shift mask.

3. The method of manufacturing a semiconductor device according to claim 1, wherein said prescribed pattern is a combination pattern of the line and space.

4. The method of manufacturing a semiconductor device according to claim 1, wherein said prescribed pattern is a gate pattern.

5. The method of manufacturing a semiconductor device according to claim 1, wherein said pattern-forming film is a polysilicon film.

6. The method of manufacturing a semiconductor device according to claim 1, wherein said film of a hard mask material is a silicon oxide film.

7. A method of manufacturing a semiconductor device; which comprises the steps of:
    forming a single layer film of a hard mask material, on a pattern-forming film which is to be used to form a prescribed pattern, and then forming a photoresist film over said film of the hard mask material;
    carrying out a first exposure using a second mask with a pattern which makes a required part in a resist region corresponding to a transcription pattern of a first mask that is to be used in a later step unexposed and makes an unrequired part therein exposed, and subsequently making a development;
    etching said film of the hard mask material using the formed resist pattern as a mask;
    removing said resist pattern and thereafter forming a photoresist film so as to cover the formed hard mask pattern;
    carrying out a second exposure using a first mask with a phase shifter and subsequently making a development;
    removing, by means of etching, an unrequired part of the hard mask using the formed resist patterns as a mask; and
    removing said resist pattern, and thereafter etching said pattern-forming film using the formed hard mask pattern as a mask.

8. The method of manufacturing a semiconductor device according to claim 7, wherein said first mask is a Levenson-type phase-shift mask.

9. The method of manufacturing a semiconductor device according to claim 7, wherein said prescribed pattern is a combination pattern of the line and space.

10. The method of manufacturing a semiconductor device according to claim 7, wherein said prescribed pattern is a gate pattern.

11. The method of manufacturing a semiconductor device according to claim 7, wherein said pattern-forming film is a polysilicon film.

12. The method of manufacturing a semiconductor device according to claim 7, wherein said film of a hard mask material is a silicon oxide film.

13. A method of manufacturing a semiconductor device; which comprises the steps of:
    forming a film of a hard mask material on a pattern-forming film which is to be used to form a prescribed pattern therein, and then forming a first photoresist film over said film of the hard mask material;
    carrying out a first exposure by using a first mask with said prescribed pattern and a phase shifter, and subsequently making a development;
    etching said film of the hard mask material by using the formed first photoresist pattern as a mask;
    forming a second photoresist film over the formed hard mask pattern;
    carrying out a second exposure by using a second mask with a pattern which covers a part of the hard mask pattern, and subsequently making a development;
    etching the hard mask pattern by using the formed second photoresist pattern as a mask; and
    etching said pattern-forming film to form said prescribed pattern by using the remaining hard mask pattern as a mask.

14. A method of manufacturing a semiconductor device; which comprises the steps of:
    forming a film of a hard mask material on a pattern-forming film which is to be used to form a prescribed pattern therein, and then forming a first photoresist film over said film of the hard mask material;
    carrying out a first exposure by using a first mask, and subsequently making a development;
    etching said film of the hard mask material by using the formed first photoresist pattern as a mask;
    forming a second photoresist film over the formed hard mask pattern;

carrying out a second exposure by using a second mask with said prescribed pattern and a phase shifter, and subsequently making a development;

etching the hard mask pattern by using the formed second photoresist pattern as a mask; and etching said pattern-forming film to form said prescribed pattern by using the remaining hard mask pattern as a mask.

15. A method of manufacturing a semiconductor device comprising:

forming a single layer film of hard mask material, on a pattern-forming film which is to be used to form a prescribed pattern, forming a first resist pattern on the film of hard mask material by carrying out a first exposure using a first mask with a phase shifter, etching the film of hard mask material using the first resist pattern as a mask, forming a second resist pattern by carrying out a second exposure using a second mask, etching the film of hard mask material using the second resist pattern as a mask, so that a hard mask having a pattern according to the prescribed pattern is formed, and etching the pattern-forming film using the hard mask to form the prescribed pattern.

16. A method of manufacturing a semiconductor device comprising:

forming a single layer film of hard mask material, on a pattern-forming film which is to be used to form a prescribed pattern, forming a first resist pattern on the film of hard mask material by carrying out a first exposure using a first mask, etching the film of hard mask material using the first resist pattern as a mask, forming a second resist pattern by carrying out a second exposure using a second mask with a phase shifter, etching the film of hard mask material using the second resist pattern as a mask, so that a hard mask having a pattern according to the prescribed pattern is formed, and etching the pattern-forming film using the hard mask to form the prescribed pattern.

* * * * *